(12) United States Patent
Tseng et al.

(10) Patent No.: US 8,278,952 B2
(45) Date of Patent: Oct. 2, 2012

(54) VOLTAGE ADJUSTING CIRCUITS AND VOLTAGE ADJUSTING METHODS

(75) Inventors: Te-Chang Tseng, Hsinchu County (TW); Chun-Yi Tu, Hsinchu (TW); Yamasaki Kyoji, Takarazuka (JP)

(73) Assignee: Powerchip Technology Corporation, Hsinchu (TW)

( * ) Notice: Subject to any disclaimer, the term of this patent is extended or adjusted under 35 U.S.C. 154(b) by 960 days.

(21) Appl. No.: 12/335,062

(22) Filed: Dec. 15, 2008

(65) Prior Publication Data
US 2009/0167094 A1    Jul. 2, 2009

(30) Foreign Application Priority Data
Dec. 31, 2007    (TW) ................................ 96151441 A

(51) Int. Cl.
*G01R 31/3187* (2006.01)
*G01R 31/26* (2006.01)
*G01R 31/14* (2006.01)
(52) U.S. Cl. ............... 324/750.3; 324/762.01; 702/117
(58) Field of Classification Search ............... 324/750.3, 324/762.01–762.1; 326/38, 80–92; 365/201; 714/718–723, 733; 702/117–120
See application file for complete search history.

(56) References Cited

U.S. PATENT DOCUMENTS

| | | | | |
|---|---|---|---|---|
| 6,157,247 A * | 12/2000 | Abdesselem et al. | ......... | 327/540 |
| 7,114,110 B2 * | 9/2006 | Kikuchi et al. | ............... | 714/736 |
| 7,162,672 B2 * | 1/2007 | Werner et al. | ................. | 714/724 |
| 7,288,965 B2 * | 10/2007 | Yamasaki et al. | ............... | 326/81 |
| 7,319,358 B2 * | 1/2008 | Senthinathan et al. | ....... | 327/538 |
| 2004/0094778 A1 | 5/2004 | Ooishi | | |
| 2006/0259840 A1 * | 11/2006 | Abadeer et al. | ............... | 714/733 |
| 2006/0273809 A1 | 12/2006 | Miller et al. | | |

FOREIGN PATENT DOCUMENTS

| | | |
|---|---|---|
| TW | 515019 | 12/2002 |
| TW | I230514 | 4/2005 |

* cited by examiner

*Primary Examiner* — Joshua Benitez Rosario
(74) *Attorney, Agent, or Firm* — Muncy, Geissler, Olds & Lowe, PLLC

(57) ABSTRACT

A voltage adjusting circuit is provided. The voltage adjusting circuit for adjusting the output voltages supplied by voltage sources includes a test control device, a multiplexer, a comparator, and a built in self test (BIST) device. The test control device selects one of the voltage sources as a testing voltage source, and outputs a selecting command for selecting the testing voltage source and a target voltage corresponding to the testing voltage source. The multiplexer is coupled to the voltage sources, receives an enablement signal, and outputs a voltage supplied by the testing voltage source as a testing voltage according to the enablement signal. The comparator compares the voltage levels of the testing voltage and the target voltage, and outputs a comparison result. The BIST device receives the selecting command, outputs the enablement signal for enabling the testing voltage source according to the selecting command, and adjusts the voltage supplied by the testing voltage source to a predetermined voltage according to the comparison result.

19 Claims, 4 Drawing Sheets

VOLTAGE ADJUSTING CIRCUITS AND VOLTAGE ADJUSTING METHODS

CROSS REFERENCE TO RELATED APPLICATIONS

This Application claims priority of Taiwan Patent Application No. TW96151441, filed on Dec. 31, 2007, the entirety of which is incorporated by reference herein.

BACKGROUND OF THE INVENTION

1. Field of the Invention

The invention relates to a voltage adjusting circuit, and more particularly to a voltage adjusting circuit using built-in self test (BIST) technology.

2. Description of the Related Art

Integrated circuit (IC) devices usually include several internal voltage sources generating voltages with different values for operating the circuit. However, since process variation may cause some drifting of the output voltage of the voltage sources, voltage sources in the IC devices need to be adjusted by a trimming circuit after manufacturing of the IC devices. The trimming circuit repeatedly tests the voltage sources so as to adjust their output voltage to approach a target value.

FIG. 1 shows a conventional trimming circuit. An integrated circuit (IC) 100 comprises voltage sources V1-V4, pads Pad 1-Pad 4 and input/output pad I/O Pad. The output voltages generated by the voltage sources V1-V4 are respectively output via the pads Pad 1-Pad 4. The testing machine 15 is an IC testing machine disposed outside of the IC 100, which receives the output voltages supplied by the voltage sources V1-V4 via the pads and compares the output voltages with target voltages that are set inside of the testing machine 15. The comparison results are fed back to the voltage sources V1-V4 via the I/O Pad to further adjust the output voltages of voltage sources V1-V4. By repeating the above steps, the output voltages of the voltage sources V1-V4 are adjusted to approach the target values.

However, as shown in FIG. 1, each voltage source requires a corresponding pad to output the generated output voltage. Thus, the amount of pads should be equal to the amount of voltage sources, thus, taking up much chip area and requiring a lot of pins. In addition, since the external testing machine has to sequentially adjust the voltage sources, time is wasted when switching the pads. Furthermore, for some specific voltage sources that need to supply voltages with extremely precise voltage levels, such as the bandgap reference voltage generator, since the signal is weak and sensitive, it is unable to be coupled to the pads for conventional voltage adjustment.

Thus, an adjusting circuit which is capable of reducing chip area, required pins and testing time, and further providing precise adjusting results is highly required.

BRIEF SUMMARY OF THE INVENTION

Voltage adjusting circuits and methods are provided. An exemplary embodiment of a voltage adjusting circuit for adjusting the output voltages supplied by voltage sources comprises a test control device, a multiplexer, a comparator, and a built in self test (BIST) device. The test control device selects one of the voltage sources as a testing voltage source, and outputs a selecting command for selecting the testing voltage source and a target voltage corresponding to the testing voltage source. The multiplexer is coupled to the voltage sources, receives an enablement signal, and outputs a voltage supplied by the testing voltage source as a testing voltage according to the enablement signal. The comparator compares the voltage levels of the testing voltage and the target voltage, and outputs a comparison result. The BIST device receives the selecting command, outputs the enablement signal for enabling the testing voltage source according to the selecting command, and adjusts the voltage supplied by the testing voltage source to a predetermined voltage according to the comparison result.

An exemplary embodiment of a voltage adjusting method is provided, comprising: selecting a first voltage source as a testing voltage source and outputting a voltage supplied by the testing voltage source as a testing voltage; selecting a target voltage corresponding to the testing voltage source and outputting the target voltage via a pad; comparing the voltage levels of the testing voltage and the target voltage and outputting a comparison result of the first voltage source accordingly; adjusting the voltage supplied by the testing voltage source to a predetermined voltage corresponding to the first voltage source according to the comparison result of the first voltage source and outputting a test result of the first voltage source; storing the test result of the first voltage source; selecting a second voltage source as the testing voltage source and outputting a voltage supplied by the testing voltage source as the testing voltage; selecting a target voltage corresponding to the testing voltage source and outputting the target voltage via the pad; comparing the voltage levels of the testing voltage and the target voltage and outputting a comparison result of the second voltage source accordingly; adjusting the voltage supplied by the testing voltage source to a predetermined voltage corresponding to the second voltage source according to the comparison result of the second voltage source and outputting a test result of the second voltage source; and storing the test result of the second voltage source.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
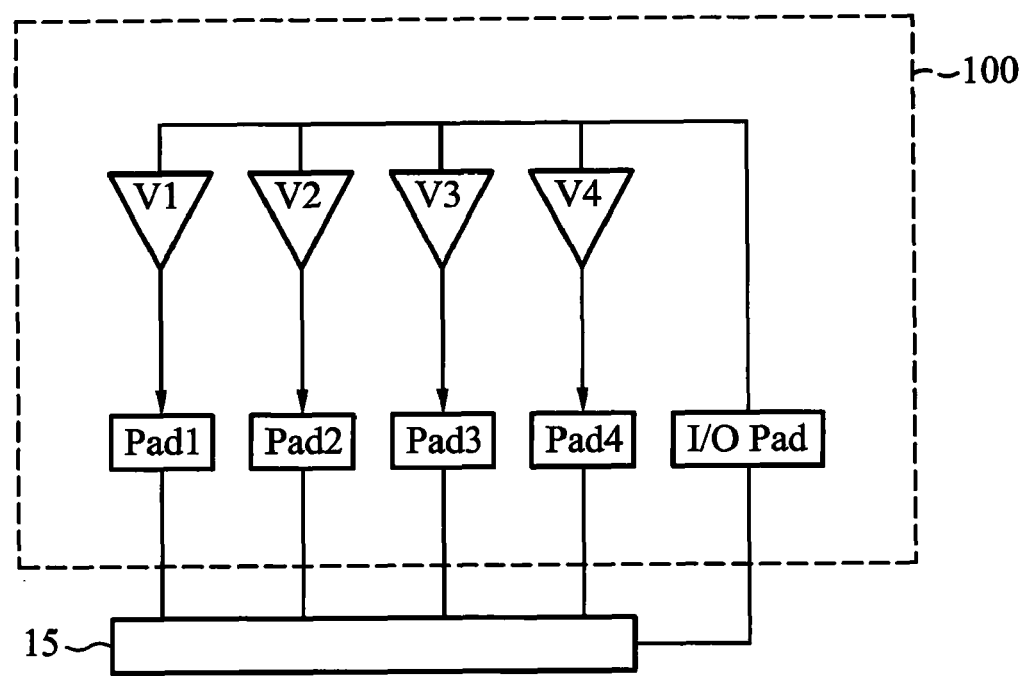
FIG. 1 shows a conventional trimming circuit.
Figure 2:
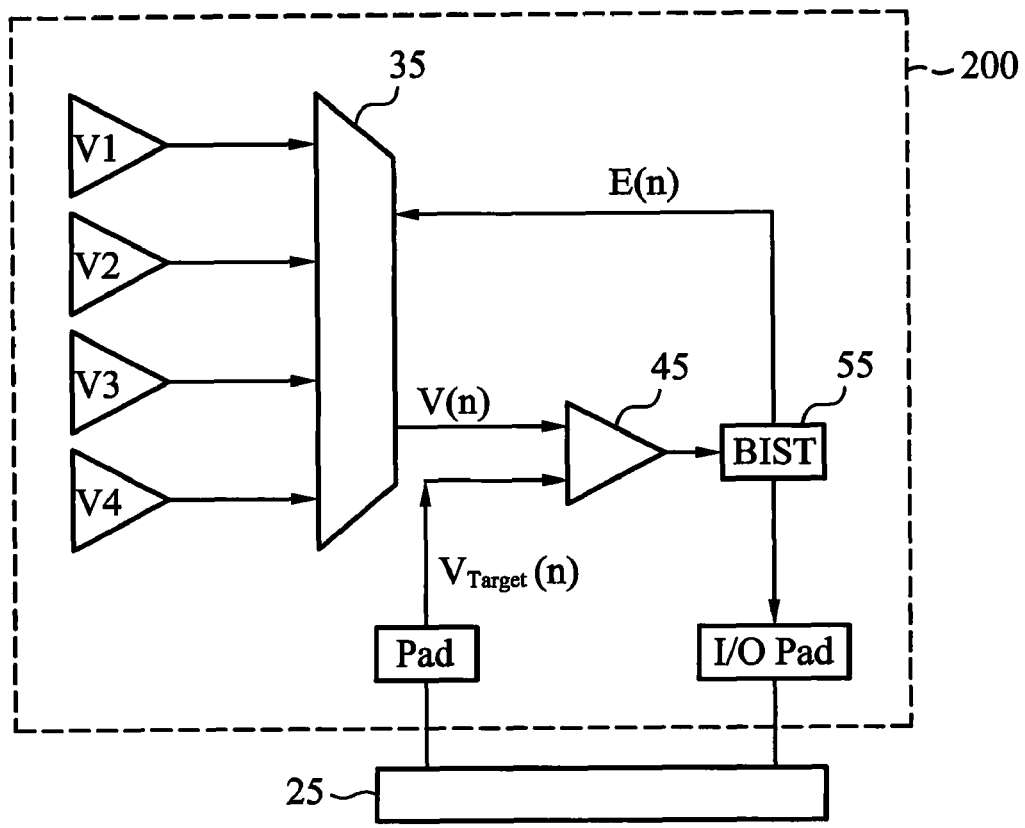
FIG. 2 shows a voltage adjusting circuit for adjusting the output voltages supplied by a plurality of voltage sources according to an embodiment of the invention.

FIG. 2 shows a voltage adjusting circuit for adjusting the output voltages supplied by a plurality of voltage sources according to an embodiment of the invention. The voltage adjusting circuit 20 comprises a test control device 25, a multiplexer 35, a comparator 45, and a built in self test (BIST) device 55. Assuming that there N voltage sources needed to be adjusted, as an example, N=4 and voltage sources labeled by V1-V4 as shown in FIG. 2, the test control device 25 records the value N in an internal memory device (not shown), and initiates a variable n stored in the internal memory device to n=1 at the beginning of the adjustment process for representing that the voltage source V1 has been selected from the voltage sources V1-V4 as a testing voltage source. The test control device 25 further outputs a selecting command for selecting the voltage source V1 to the BIST device 55, and outputs a target voltage $V_{Target}(n)$ corresponding to the voltage source V1 via a pad Pad shown in FIG. 2. The BIST device 55 receives the selecting command from the test control device 25, outputs an enablement signal E(n) for enabling the currently selected testing voltage source according to the selecting command. Since the currently selected testing voltage source is the voltage source V1, the BIST device 55 outputs the enablement signal E(n) for enabling the voltage source V1. The multiplexer 35 is connected to the voltage sources V1-V4, receives the enablement signal E(n) from the BIST device 55, and outputs a voltage supplied by the testing voltage source as a testing voltage V(n) according to the enablement signal E(n). Since the currently selected testing voltage source is the voltage source V1, the multiplexer 35 outputs the voltage currently supplied by the voltage source V1 as the testing voltage V(n). As shown in FIG. 2, the testing voltage V(n) and the target voltage $V_{Target}(n)$ are input to the comparator 45. The comparator compares the voltage levels of the testing voltage V(n) and the target voltage $V_{Target}(n)$, and accordingly outputs a comparison result to the BIST device 55. The BIST device 55 adjusts the voltage supplied by the testing voltage source (currently is V1) to a predetermined voltage (will be illustrated later in the following paragraph) according to the received comparison result. According to the embodiment of the invention, when the predetermined voltage exceeds or equals to the target voltage $V_{Target}(n)$ of the voltage source V1, the adjustment process of voltage source V1 is finished. However, it is to be understood that the adjustment process may also be finished according to other conditions and the invention is not limited thereto.

According to the embodiment of the invention, the BIST device 55 comprises a register (not shown) storing a maximum adjustable voltage and an adjustment result corresponding to each voltage source V1-V4. The BIST device 55 further controls the voltage adjustment process of the testing voltage source according to the received comparison results. When the comparison result represents that the testing voltage V(n) is smaller than the target voltage $V_{Target}(n)$, the BIST device 55 further determines whether the testing voltage V(n) exceeds the maximum adjustable voltage $V_{max}(n)$ of the testing voltage source. When the testing voltage V(n) does not exceed the maximum adjustable voltage $V_{max}(n)$ of the testing voltage source, the BIST device 55 outputs an increase indication signal to the testing voltage source to direct the testing voltage source to increase its supplied voltage to an increased voltage, and the multiplexer 35 outputs the increased voltage as a new testing voltage V(n) of the testing voltage source. According to an embodiment of the invention, the method for increasing the supplied voltage of the voltage source is to add a delta voltage value $\Delta V$ on the original supplied voltage. As an example, when $\Delta V=0.1V$, the original supplied voltage is V(n) adjusted to (V(n)+0.1) and thus, $(V_{new}(n)=V_{orig}(n)+0.1)$. However, it is to be understood that the testing voltage may also be increased according to other methods and the invention is not limited thereto. After the multiplexer 35 outputs the new testing voltage V(n), the comparator 45 compares voltage levels of the new testing voltage V(n) and the target voltage $V_{Target}(n)$, and outputs the comparison result to the BIST device 55.

On the other hand, when the comparison represents that the testing voltage V(n) is smaller than the target voltage $V_{Target}(n)$, and the BIST device 55 determines that the testing voltage V(n) exceeds or equals to the maximum adjustable voltage $V_{max}(n)$ of the testing voltage source, the BIST device 55 transmits a fail signal to the test control device 25 and stores information indicating that the adjustment result of the testing voltage source has failed in the register.

Finally, when the comparison result represents that the testing voltage equals to or exceeds the target voltage $V_{Target}(n)$, the BIST device 55 transmits a pass signal to the test control device 25 and stores the testing voltage V(n) in the register as the adjustment result of the testing voltage source V1.

After the test control device 25 receives the pass signal or the fail signal, which means that the test and adjustment process of the testing voltage source V1 is finished, the test control device 25 records the test result of testing voltage source V1 in the internal memory device according to the received signals and determines whether the value of n exceeds or equals to the value N of the amount of voltage sources needed to be adjusted. When (n<N), it means that not all of test and adjustment process of the voltage sources needed to be adjusted have been finished. Thus, the test control device 25 increases the value (n=n+1) for selecting the next voltage source as the testing voltage source. As an example, after the voltage source V1 (n=1) has finished its testing and adjustment process, the test control device 25 selects the voltage source V2 (n=2) as the testing voltage source, outputs another selecting command for selecting the voltage source V2, and outputs the target voltage corresponding to the voltage source V2 via the pad Pad to continue the similar test and adjustment process as the voltage source V1 previously described.

According to an embodiment of the invention, the BIST device 55, the multiplexer 35, and the comparator 45 are disposed in an integrated circuit, such as the integrated circuit 200 shown in FIG. 2. The integrated circuit may be a flash memory integrated circuit, and the voltage sources V1-V4 may be the voltage sources disposed inside of the integrated circuit. As shown in FIG. 2, the test control device 25 outputs the target voltage corresponding to each voltage source via a single pad Pad, and outputs the commands and receives signals from the BIST device 55 via the input/output pad I/O Pad. In addition, after receiving the pass signal or the fail signal, the test control device 25 further outputs a write command to the BIST device 55 so as to control the BIST device 55 to write the adjustment result corresponding to the testing voltage source in a storage unit of the flash memory integrated circuit for being the adjustment result of the corresponding voltage sources. As a result, the voltage sources of the integrated circuit may be finer tuned according to the recorded adjustment results so as to provide the optimum supplied voltages for each integrated circuit.

Figure 3:
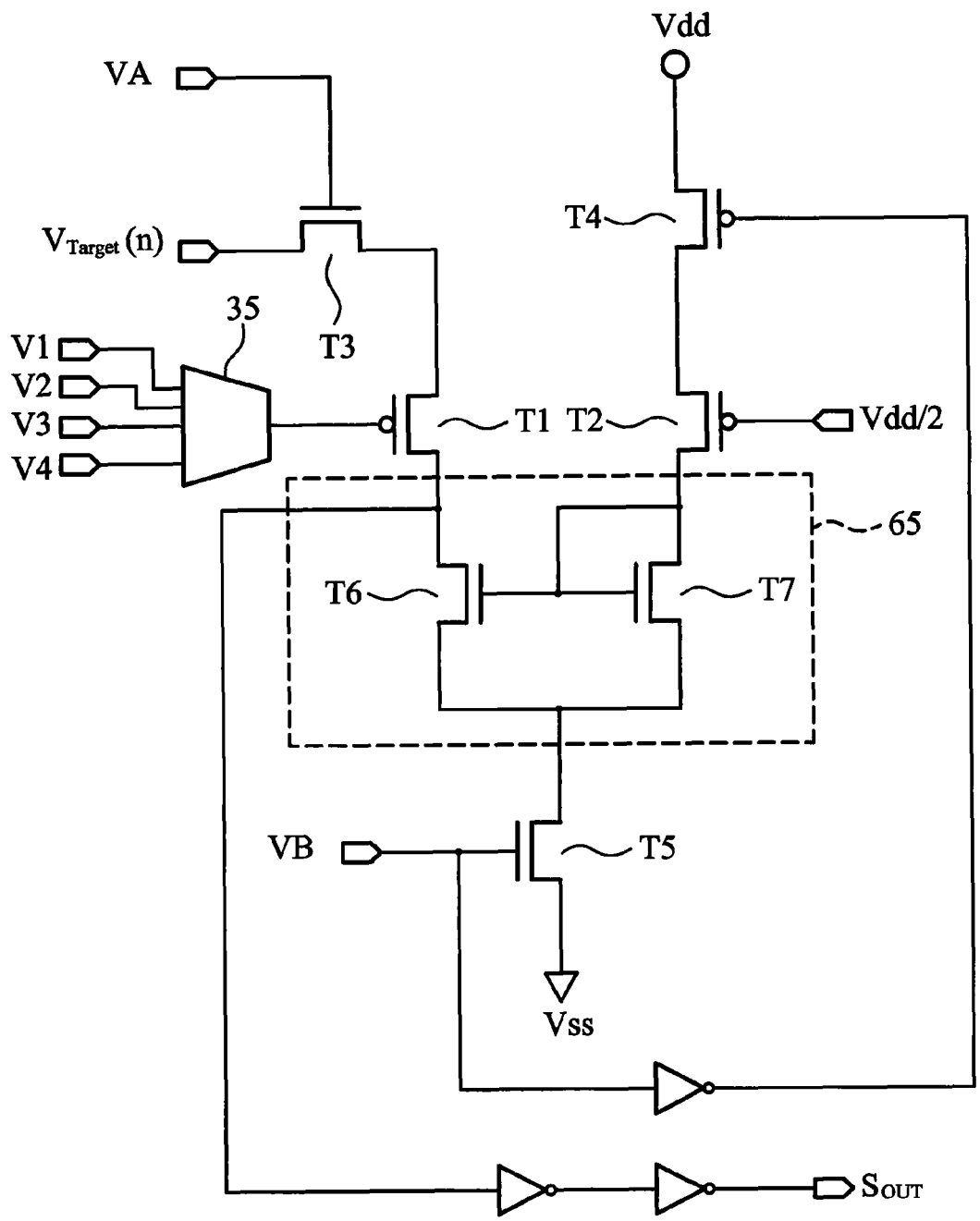
FIG. 3 shows a comparator circuit according to an embodiment of the invention.

According to the embodiment of the invention, the comparator 45 may be a high voltage comparator capable of receiving input signals with voltage distributed within 0V to 26V. Thus, as shown in FIG. 2, the test control device 25 may output the target voltages of the voltage sources V1-V4 via a single pad Pad. FIG. 3 shows a comparator circuit according to an embodiment of the invention. As shown in FIG. 3, the comparator 45 comprises transistors T1-T7. The source of the transistor T1 (first first node) receives the target voltage $V_{Target}(n)$, and the gate of the transistor T1 (first second node) receives the testing voltage V(n). The source of the transistor T2 (second first node) receives the reference voltage Vdd, and the gate of the transistor T2 (second second node) receives the reference voltage Vdd/2. The transistor T3 controls the input of target voltage $V_{Target}(n)$ according to the control voltage VA. The transistor T4 controls the input of reference voltage Vdd according to the inverse of the control voltage VB. The transistors T6 and T7 form a current mirror 65 coupling to the transistors T1 and T2. The transistor T5 coupling the current mirror 65 to the voltage Vss according to the control voltage VB. Compared to the conventional comparator circuit, the comparator 45 couples the transistor T1 to the target voltage $V_{Target}(n)$ so as to receive a wider range of voltages, and outputs the comparison result signal $S_{OUT}$ at a connection node of the transistors T1 and T6.

Figure 4:
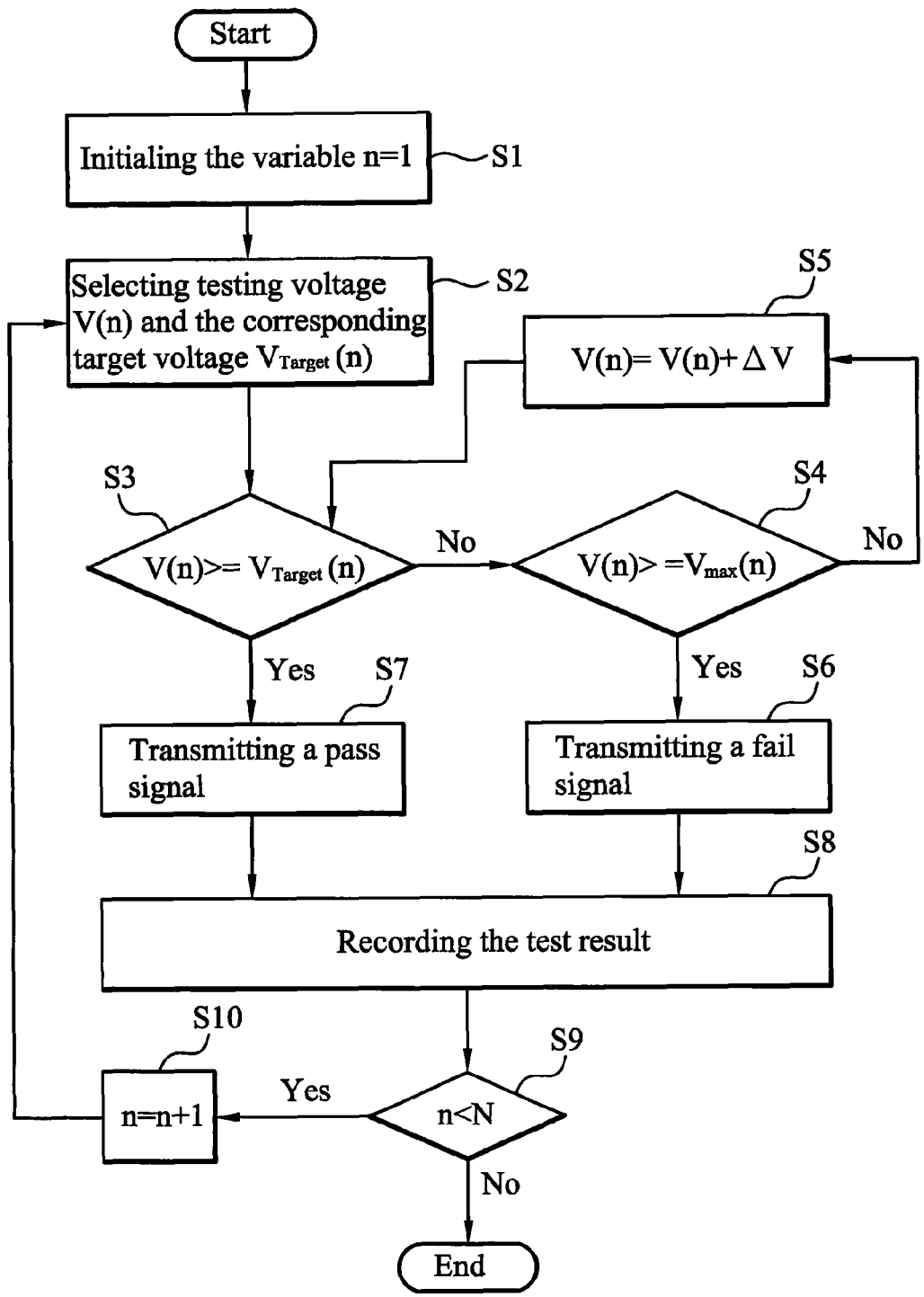
FIG. 4 shows a flow chart of the voltage adjusting method according to an embodiment of the invention.

FIG. 4 shows a flow chart of the voltage adjusting method according to an embodiment of the invention. As previously described, the voltage adjustment process begins with initialing the variable n=1 (Step S1) and selecting one testing voltage V(n) and the corresponding target voltage $V_{Target}(n)$ (Step S2). Next, the voltage levels of the testing voltage V(n) and the target voltage $V_{Target}(n)$ are compared to determine whether V(n) exceeds or equals to $V_{Target}(n)$ (Step S3). When V(n) is determined smaller than $V_{Target}(n)$, whether V(n) exceeds or equals to the maximum adjustable voltage $V_{max}(n)$ is further determined (Step S4). When V(n) is determined smaller than $V_{max}(n)$, the testing voltage, V(n) is increased by V(n)=V(n)+ΔV (Step S5) and the adjustment process moves back to step S3 to compare again the voltage levels of the testing voltage V(n) and the target voltage $V_{Target}(n)$. When the testing voltage V(n) is determined to exceed or equal to the maximum adjustable voltage $V_{max}(n)$, a fail signal is transmitted to the test control device (Step S6).

On the other hand, when the testing voltage V(n) is determined to exceed or equal to the target voltage $V_{Target}(n)$, a pass signal is transmitted to the test control device (Step S7). The test control device 25 records the test result according to the pass signal or the fail signal (Step S8), and determines whether the value of variable n is smaller than N (Step S9). When n is smaller than N, which means that not all of the voltage sources have finished the test and adjustment process, the variable n is increased by n=n+1 (Step S10) for selecting the next voltage source as the testing voltage source, and the procedure returns to step S2 to select the testing voltage V(n) and corresponding target voltage $V_{Target}(n)$. When n is determined to exceed or equal to N, which means that all of the voltage sources have finished the test and adjustment process, the voltage adjustment process may be terminated.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A voltage adjusting circuit for adjusting the output voltages supplied by a plurality of voltage sources, comprising:
    a test control device selecting one of the voltage sources as a testing voltage source, outputting a selecting command for selecting the testing voltage source, and outputting a target voltage corresponding to the testing voltage source via a pad;
    a multiplexer coupled to the voltage sources, receiving an enablement signal, and outputting a voltage supplied by the testing voltage source as a testing voltage according to the enablement signal;
    a comparator receiving the testing voltage and the target voltage, comparing the voltage levels of the testing voltage and the target voltage, and outputting a comparison result accordingly; and
    a built-in self test (BIST) device receiving the selecting command, outputting the enablement signal for enabling the testing voltage source according to the selecting command, and adjusting the voltage supplied by the testing voltage source to a predetermined voltage according to the comparison result, wherein when the voltage supplied by the testing voltage source is adjusted to the predetermined voltage, the test control device selects another voltage source from the voltage sources as the testing voltage source, outputs another selecting command for selecting the testing voltage source, and outputs the target voltage corresponding to the testing voltage source via the pad.

2. The voltage adjusting circuit as claimed in claim 1, wherein the predetermined voltage exceeds or equals to the target voltage.

3. The voltage adjusting circuit as claimed in claim 1, wherein the BIST device comprises a register storing a maximum adjustable voltage and an adjustment result corresponding to each voltage source.

4. The voltage adjusting circuit as claimed in claim 3, wherein when the comparison result represents that the testing voltage equals to or exceeds the target voltage, the BIST device transmits a pass signal to the test control device and stores the testing voltage in the register as the adjustment result of the testing voltage source.

5. The voltage adjusting circuit as claimed in claim 4, wherein when the comparison result represents that the testing voltage is smaller than the target voltage, the BIST device further determines whether the testing voltage exceeds the maximum adjustable voltage of the testing voltage source, transmits a fail signal to the test control device when the testing voltage exceeds the maximum adjustable voltage of the testing voltage source, and stores information indicating that the adjustment result of the testing voltage source has failed in the register.

6. The voltage adjusting circuit as claimed in claim 5, wherein when the testing voltage does not exceed the maximum adjustable voltage of the testing voltage source, the BIST device transmits an increase indication signal to the testing voltage source, and wherein the testing voltage source increases its supplied voltage to an increased voltage and outputs the increased voltage as the testing voltage according to the increase indication signal.

7. The voltage adjusting circuit as claimed in claim 5, wherein the voltage sources, the BIST device, the multiplexer, the pad and the comparator are disposed in a flash memory integrated circuit.

8. The voltage adjusting circuit as claimed in claim 7, wherein the test control device outputs a write command to the BIST device after receiving the pass signal or the fail signal to control the BIST device to write the adjustment result corresponding to the testing voltage source in a storage unit of the flash memory integrated circuit.

9. The voltage adjusting circuit as claimed in claim 5, wherein the test control device comprises a memory device for recording a test result of each testing voltage source according to the pass signal or the fail signal received from the BIST device, and wherein the test control device selects another voltage source from the voltage sources as the testing voltage source, outputs another selecting command for selecting the testing voltage source, and outputs the target voltage corresponding to the testing voltage source via the pad after receiving the pass signal or the fail signal.

10. The voltage adjusting circuit as claimed in claim 1, wherein the comparator receives input signals with voltage between 0V to 26V.

11. The voltage adjusting circuit as claimed in claim 1, wherein the comparator comprises:
   a first transistor comprising a first first node receiving the target voltage and a first second node receiving the testing voltage;
   a second transistor comprising a second first node receiving a first reference voltage and a second second node receiving a second reference voltage, wherein the voltage level of the second reference voltage is substantially half of the voltage level of the first reference voltage; and
   a current mirror circuit coupled to the first transistor and the second transistor at a first connection node and a second connection node, respectively, wherein the comparator outputs the comparison result at the first connection node.

12. A voltage adjusting method, comprising:
   selecting a first voltage source as a testing voltage source and outputting a voltage supplied by the testing voltage source as a testing voltage;
   selecting a target voltage corresponding to the testing voltage source and outputting the target voltage via a pad;
   comparing the voltage levels of the testing voltage and the target voltage and outputting a comparison result of the first voltage source accordingly;
   adjusting the voltage supplied by the testing voltage source to a predetermined voltage corresponding to the first voltage source according to the comparison result of the first voltage source and outputting a test result of the first voltage source;
   storing the test result of the first voltage source; and after said storing,
   selecting a second voltage source as the testing voltage source and outputting a voltage supplied by the testing voltage source as the testing voltage;
   selecting a target voltage corresponding to the testing voltage source and outputting the target voltage via the pad;
   comparing the voltage levels of the testing voltage and the target voltage and outputting a comparison result of the second voltage source accordingly;
   adjusting the voltage supplied by the testing voltage source to a predetermined voltage corresponding to the second voltage source according to the comparison result of the second voltage source and outputting a test result of the second voltage source; and
   storing the test result of the second voltage source.

13. The voltage adjusting method as claimed in claim 12, wherein the predetermined voltage corresponding to the first voltage source and the predetermined voltage corresponding to the second voltage source respectively exceeds or is equal to the target voltage corresponding to the first voltage source and the target voltage corresponding to the second voltage source.

14. The voltage adjusting method as claimed in claim 12, further comprising storing a maximum adjustable voltage and an adjustment result corresponding to the first voltage source and storing a maximum adjustable voltage and an adjustment result corresponding to the second voltage source in a register.

15. The voltage adjusting method as claimed in claim 14, wherein when the comparison result represents that the testing voltage equals to or exceeds the target voltage of the testing voltage source, outputting a pass signal as the test result of the testing voltage source, and storing the testing voltage in the register as the adjustment result corresponding to the testing voltage source.

16. The voltage adjusting method as claimed in claim 15, wherein when the comparison result represents that the testing voltage is smaller than the target voltage of the testing voltage source, determining whether the testing voltage exceeds the maximum adjustable voltage of the testing voltage source, outputting a fail signal as the test result when the testing voltage exceeds the maximum adjustable voltage of the testing voltage source, and storing information indicating that the adjustment result of the testing voltage source has failed in the register.

17. The voltage adjusting method as claimed in claim 16, wherein when the testing voltage does not exceed the maximum adjustable voltage of the testing voltage source, outputting an increase indication signal to the testing voltage source, increasing the supplied voltage of the testing voltage source to an increased voltage, and outputting the increased voltage as the testing voltage according to the increase indication signal.

18. The voltage adjusting method as claimed in claim 16, wherein the first voltage source, the second voltage source, the register and the pad are disposed in a flash memory integrated circuit.

19. The voltage adjusting method as claimed in claim 18, wherein after receiving the pass signal or the fail signal, writing the adjustment result corresponding to the testing voltage source in a storage unit of the flash memory integrated circuit.

\* \* \* \* \*